United States Patent

Bourez et al.

[11] Patent Number: 6,063,248
[45] Date of Patent: May 16, 2000

[54] PROCESS CHAMBER ISOLATION SYSTEM IN A DEPOSITION APPARATUS

[75] Inventors: Allen Bourez, San Jose; Eugene V. Anoikin, Fremont, both of Calif.

[73] Assignee: HMT Technology Corporation, Fremont, Calif.

[21] Appl. No.: 09/191,485

[22] Filed: Nov. 12, 1998

[51] Int. Cl.[7] ............................. C23C 14/34; C23C 14/46
[52] U.S. Cl. ................. 204/298.25; 204/298.04; 118/719; 118/723 CB; 118/723 E
[58] Field of Search ..................... 204/298.01, 298.02, 204/298.04, 298.25; 118/719, 723 CB, 723 E, 50

[56] References Cited

U.S. PATENT DOCUMENTS

| | | | |
|---|---|---|---|
| 3,901,183 | 8/1975 | Wittkower | 118/728 |
| 4,556,471 | 12/1985 | Bergman et al. | 118/733 |
| 4,680,061 | 7/1987 | Lamont, Jr. | 204/192.12 |
| 4,824,545 | 4/1989 | Arnold et al. | 118/719 |

*Primary Examiner*—Shrive Beck
*Assistant Examiner*—Bret Chen
*Attorney, Agent, or Firm*—Judy M. Mohr; Dehlinger & Associates

[57] ABSTRACT

An improvement in an apparatus having an external casing defining a processing chamber for deposition of a film on a substrate and an opening in the processing chamber through which a substrate is introduced for deposition is described. The improvement comprises an internal casing member moveably mounted within the processing chamber for movement between a first position which allows deposition onto the substrate to occur and a second position at which the casing is in sealing engagement with the opening to form an isolation chamber within the processing chamber and effective to isolate the substrate from processing chamber. The invention also includes a method for reducing cross-contamination between processing chambers in such an apparatus and a method for reducing particulate contamination to media prepared in such a deposition apparatus.

10 Claims, 9 Drawing Sheets

PROCESS CHAMBER ISOLATION SYSTEM IN A DEPOSITION APPARATUS

FIELD OF THE INVENTION

The present invention relates to an apparatus for deposition of a thin film on a substrate within a processing chamber in the apparatus and to an isolation chamber in the processing chamber.

BACKGROUND OF THE INVENTION

In the magnetic media industry, high-performance, thin-film media are produced by depositing successive layers on a substrate. Apparatus for preparation of such media are well known in the art, and for media of the type formed on a rigid disc substrate, typically in such an apparatus each layer in the medium is deposited in a separate processing chamber. For example, the underlayer, the magnetic layer and the overcoat layer are generally deposited in separate processing chambers.

The main or common transport chamber in the apparatus during preparation of the medium is maintained at a low working pressure, e.g. typically less than about $5 \times 10^{-7}$ Torr, by means of a high performance vacuum pump. The processing chambers in the apparatus are positioned along the main chamber and receive substrates for sequential processing.

One problem with the conventional deposition apparatus is cross-contamination of deposition materials between the processing chambers. For example, after deposition of a carbon overcoat onto a magnetic medium and removal of the substrate from the carbon-overcoat processing chamber for transfer to a processing chamber downstream, carbon and/or other materials in the carbon-overcoat processing chamber can migrate to any of the other chambers in the apparatus, including those chambers for deposition of the magnetic recording layer and the underlayer. This is particularly a problem when a carbon overcoat is deposited by ion beam deposition, since any remaining gas, e.g., ethylene, in the chamber can readily migrate to other chambers. Naturally, is such cross-contamination is undesirable, since it can effect the properties of the medium.

Another problem encountered with preparation of carbon overcoats in conventional deposition apparatus is buildup of particulate contaminants within the processing chamber. This problem is encountered when carbon overcoats are deposited from a graphite sputtering target and by ion beam deposition. The particulate matter must be removed from the apparatus before it begins to flake and peel causing defects in the medium. Removal of the particulate contamination typically necessitates a shut-down of the apparatus, reducing productivity.

SUMMARY OF THE INVENTION

Accordingly, it is an object of the invention to provide an improvement in a sputtering apparatus that allows for cleaning by removal of contaminants in a processing chamber as a part of the processing flow, e.g., with no requirement of a complete shut down of the system.

It is a further object of the invention to provide an improvement in a sputtering apparatus that reduces the cross-contamination between processing chambers.

In one aspect, the invention includes an improvement in an apparatus having an external casing defining a processing chamber for deposition of a film on a substrate and an opening in the processing chamber through which a substrate is introduced for deposition. The improvement comprises an internal casing member moveably mounted within the processing chamber for movement between a first position which allows deposition onto the substrate to occur and a second position at which the casing is in sealing engagement with the opening to form an isolation chamber within the processing chamber and effective to isolate the substrate from processing chamber.

In one embodiment, the processing chamber is at a deposition pressure when the internal casing member is in the first, deposition position and the apparatus further includes a first means for reducing the deposition pressure when the internal casing is in the first position.

In another embodiment, the apparatus includes a second means for reducing the deposition pressure when the casing is in the second position, where the first and second means for reducing disposed such that the first means for reducing is effective to change the deposition pressure in the processing chamber and the second means for reducing is effective to change the pressure in the isolation chamber.

In still another embodiment, the first and second means for reducing are vacuum pumps.

The processing chamber further includes, in one embodiment, a means for depositing a film on the substrate. Such means include any means known to those of skill in the art which is suitable to achieve deposition of a desired material onto the substrate. For example, deposition by ion beam deposition includes a source for an ion beam and the deposition material; deposition by sputtering includes a sputtering target and a voltage source to energize the target; deposition by chemical vapor deposition would include an electrode, such as an RF electrode, and the deposition material, typically an ionizable gas.

The substrate, in one embodiment, is a rigid, disc substrate.

In another aspect, the invention includes a method for reducing particulate deposits in a processing chamber in an apparatus for deposition of a film on a substrate, the apparatus including an opening in the processing chamber through which a substrate is introduced for deposition. The method includes moving an internal casing member mounted within the processing chamber from a first position which allows deposition onto the substrate to occur to a second position at which the casing is in sealing engagement with the opening to form an isolation chamber within the processing chamber and effective to isolate the substrate from processing chamber; and introducing a cleaning gas into the processing chamber, where the cleaning gas effective to reduce the particulate deposit in the processing chamber.

In one embodiment of this aspect, prior to moving the casing member, the method includes introducing a processing gas into the processing chamber and depositing a film onto the substrate.

The processing gas is an ionizable gas for ion beam deposition on the substrate, in one embodiment. In other embodiments, the processing gas is an inert gas or a cleaning gas.

The method further includes, in yet another embodiment, after depositing the film onto the substrate and prior to the moving, evacuating the processing chamber, which is at a deposition pressure when the internal casing member is in the first, deposition position, by a first pressure-reducing means.

In this embodiment, the method can further include, after introduction of cleaning gas, evacuating the isolation chamber by a second pressure-reducing means.

In a third aspect of the invention, a method of reducing cross-contamination of processing gases between processing chambers in an apparatus for deposition of a film on a substrate is described and claimed. The apparatus includes an opening in each processing chamber through which a substrate is introduced for deposition, and the claimed method comprises moving an internal casing member mounted within at least one of the processing chambers from a first position which allows deposition onto the substrate to occur to a second position at which the casing is in sealing engagement with the opening to form an isolation chamber within the processing chamber and effective to isolate the substrate from processing chamber; evacuating the processing chamber by a first pressure-reducing means; and evacuating the isolation chamber by a second pressure-reducing means.

In one embodiment of this aspect, the method further includes prior to moving, introducing a processing gas into the processing chamber for deposition of the film onto the substrate. The processing gas is an ionizable gas for ion beam deposition on the substrate or a hydrocarbon gas for deposition of a carbon overcoat or an inert gas.

In another embodiment, the method further includes introducing a cleaning gas into the processing chamber after evacuating the processing chamber, where the processing gas effective to reduce the particulate deposits in the chamber, and evacuating the processing chamber after cleaning.

These and other objects and features of the invention will be more fully appreciated when the following detailed description of the invention is read in conjunction with the accompanying drawings.

BRIEF DESCRIPTION OF THE DRAWINGS

The structure and manner of operation of the invention, together with the further objects and advantages thereof, may best be understood by reference to the following description taken in conjunction with the accompanying drawings, in which identical reference numerals identify similar elements, and in which.

DETAILED DESCRIPTION OF THE INVENTION

One aspect of the present invention provides an apparatus having a processing chamber, and often a plurality of processing chambers, for deposition of a film on a substrate. The substrate is preferably a rigid disc-like substrate of the type used in as the magnetic storage medium in computer disc-drives. The substrate can be either metallic or glass, as is known in the art.

Figure 1:
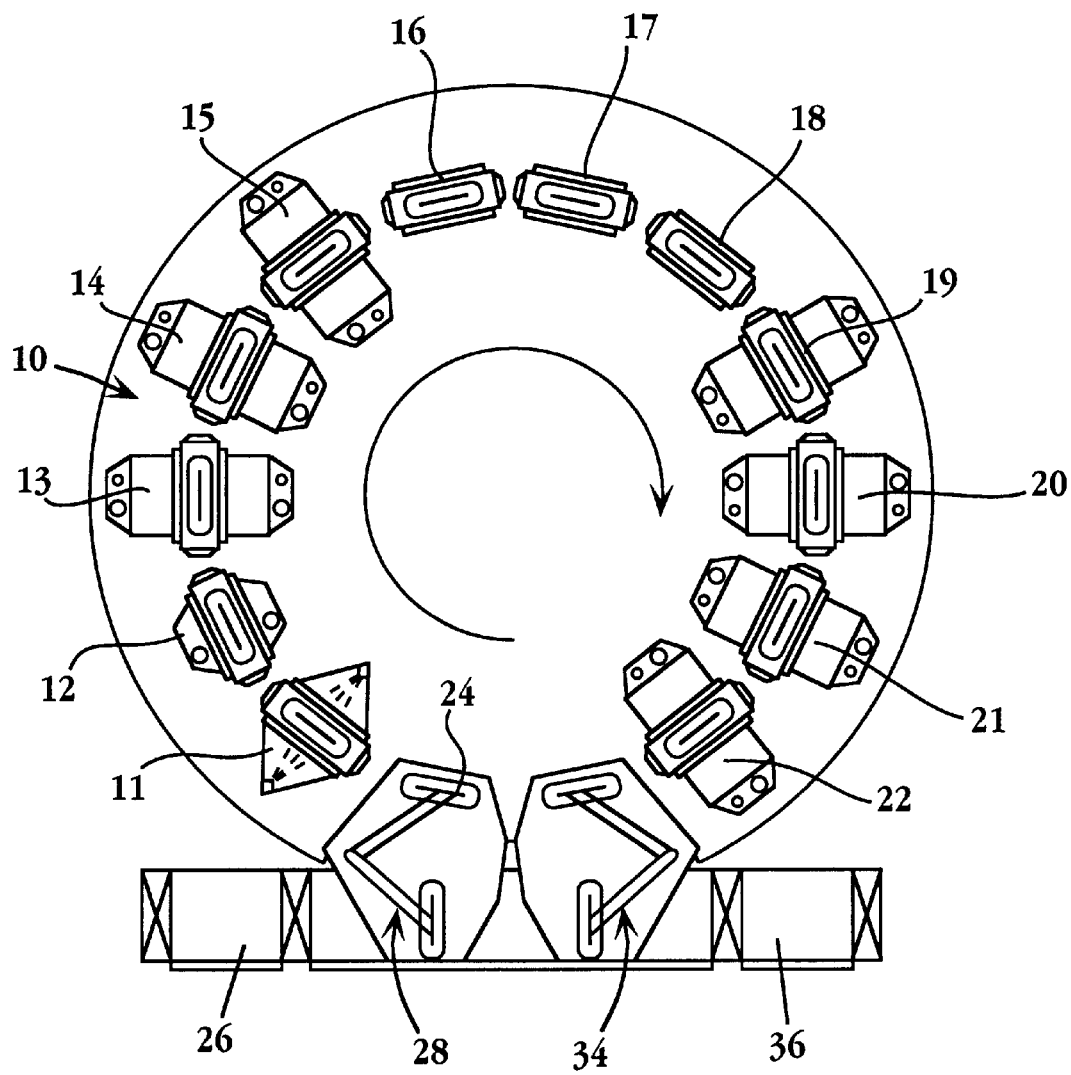
FIG. 1 is a schematic representation of a deposition apparatus which includes at least one processing chamber in accord with the invention and which shows the processing chambers and the direction of process flow.

FIG. 1 is a schematic representation of a deposition apparatus incorporating at least one processing station with an isolation chamber, in accordance with an embodiment of the invention. A main chamber, indicated by reference numeral 10, is shown having a plurality of processing chambers or stations, depicted generically and designated as chambers 11–22, which can communicate with main chamber 10. The circular arrow in FIG. 1 indicates the direction of process flow (i.e., substrate movement and processing) along main chamber 10. Substrate discs are shown schematically, as indicated by the numeral 24, at various positions along the system.

Prior to entering the sputtering system, a disc substrate is placed into a load-lock, or introduction chamber 26. Load-lock 26 serves as an interface between the external ambient pressure, e.g., atmospheric pressure, and the ultra-high vacuum environment of the deposition apparatus. After the load-lock has been pumped down to a low pressure (about $5 \times 10^{-6}$ Torr) by, for example, a cryopump or turbopump (not shown), the disc substrate is moved along to a transfer position. Here, a robotic load arm 28 engages the disc substrate for transfer onto a carousel, not visible in FIG. 1 but indicated generally by the reference numeral 30 in FIG. 2A.

The carousel 30 transports the disc substrate from one station to the next for processing. The entire process flow pathway is protected from the external environment by a containment enclosure (not shown). This allows the entire system, including the process stations and substrate transfer pathways between stations, to be maintained at a reduced pressure. Any suitable evacuation means may be employed, such as a cryopump or turbopump. A disc holder or disc gripper 34 (FIG. 2A) holds and properly positions the disc at each station so that processing can be effected (e.g., deposition, sputtering). Once a substrate has left the final station along the processing line, such as chamber 22 in the figure, it is engaged by a robotic unload arm 34 and transferred to an unload position. The processed disc is then introduced to an unload-lock 36 that serves as an interface between the ultra-high vacuum environment of the deposition apparatus, and the external ambient pressure, e.g., atmospheric pressure. At unload-lock 36, the pressure can be restored to ambient pressure without affecting the vacuum of the deposition system. The processed disc can then be removed from the deposition apparatus.

Processing chambers 11–22 are configured for deposition of successive layers onto the disc substrate. For example, the chambers can take the following configuration: two substrate heating chambers, 11, 12; two underlayer sputtering stations, 13, 14; a magnetic-layer sputtering chamber, 15; a station for sensing temperature of the substrate, 16; two blank process stations, 17, 18; and four over-coat sputtering stations, 19, 20, 21 and 22. It will be appreciated that the function of each station can be varied according to the desired configuration of the magnetic medium, including the thickness of the layers in the medium and the composition of each layer.

In sum, by way of the above arrangement, substrate discs are loaded using a load-lock chamber and then transferred to or between any process stations within the ultra-high vacuum environment of the deposition apparatus. Transport of the discs from the load-lock, through the main chamber and processing chambers at to the unload-lock is accomplished by any suitable moving means, such as robotic arms, a disc gripper, such as that described in U.S. Pat. No. 5,543,022. Exemplary deposition systems include conventional sputtering systems, such as those available from Intevac (Santa Clara, Calif.), Circuits Processing Apparatus (Fremont, Calif.), ULVAC (Japan), Leybald Heraeus (Germany), VACTEC (Boulder, Colo.), or ANELVA (Japan), as well as such systems equipped for ion beam deposition, plasma vapor deposition, chemical vapor deposition, and the like.

Figure 2A:
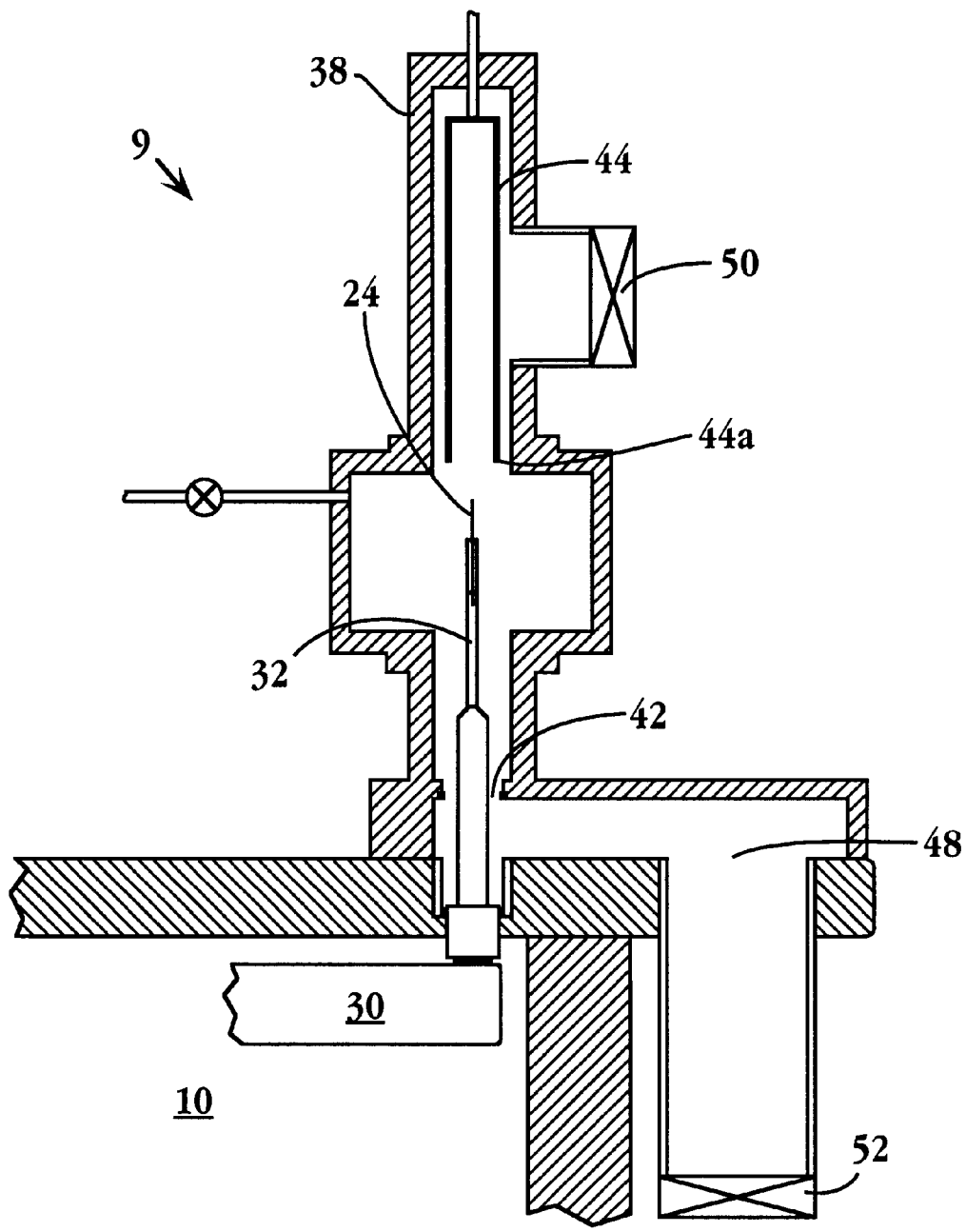
FIGS. 2A–2B are schematic representations of a processing chamber in accord with the invention and suitable for use in an apparatus of FIG. 1, and show a rigid disc substrate held on a disc-holder within the processing chamber for deposition onto both sides of the substrate (FIG. 2A) and the disc held on the disc-holder within the isolation chamber (FIG. 2B)

FIG. 2A is a schematic representation of a processing or deposition chamber in accord with the invention for use in a conventional deposition apparatus, like that discussed with reference to FIG. 1. Those components that are identical to the previously described components have been identified by the same reference numerals and will not be described again in detail.

FIG. 2A shows a processing chamber 19, which is representative. The processing chamber includes an external casing 38 which defines a processing chamber 40 where disc substrate 24 is positioned for processing. External casing is formed of any material typically employed for such processing stations in vacuum deposition systems. As discussed previously, disc 24 is supported on a disc holder or gripper 32, which in turn is supported on carousel 30, for movement in and out of processing chamber 40 through opening 42 in the processing chamber.

Figure 2B:
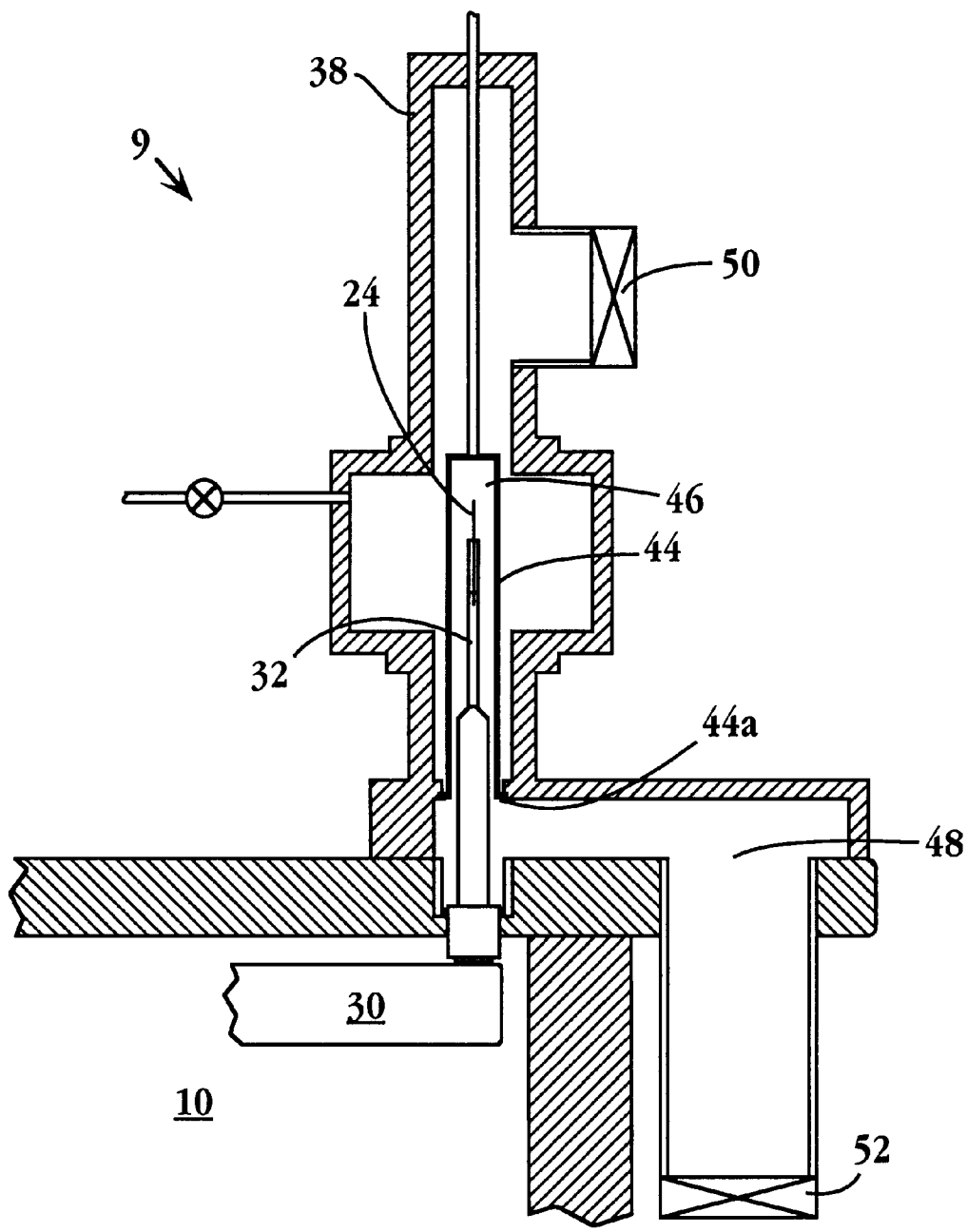

An internal casing member 44 is moveably mounted with processing chamber 40. Internal casing member 44 moves between a first position which allows for deposition onto the disc substrate and a second position, as shown in FIG. 2B. In the second position, the internal casing member engages opening 42 and forms a seal, preferably a vacuum tight seal by means of sealing gaskets or o-rings positioned within the opening and/or the engaging portion 44a of the internal casing member. When the internal casing is in sealing engagement with the opening to the processing chamber, the internal casing member defines an isolation chamber 46 within the processing chamber. As can be seen, the disc within the isolation chamber is effectively isolated from the processing chamber.

The external casing further defines a buffer chamber 48 which is in communication with the processing chamber when the internal casing member is in its deposition position (FIG. 2A). When the internal casing member is in its isolation position, the buffer chamber is in communication with the isolation chamber, as seen in FIG. 2B.

A first means for reducing the pressure in the processing chamber is provided in one preferred embodiment of the invention. Such means is preferably a vacuum means such as turbo-pump or cryopump. In one embodiment, a turbopump backed up by a mechanical pump is employed. A high-vacuum valve 50 assists in regulation of gas flow along a pathway extending between the processing chamber and the turbopump (not shown in the figures). The first means for reducing the pressure is effective to reduce the pressure (e.g., evacuate) the chamber when the internal casing member is in either position, as can be seen in FIGS. 2A and 2B. In another embodiment, the apparatus further includes a second means for reducing the pressure in the processing chamber when the internal casing is in its first position that allows for deposition onto the disc substrate (FIG. 2A), and for reducing the pressure in the isolation chamber and the buffer chamber when the internal casing is in its second position in sealing engagement with the opening in the processing chamber (FIG. 2B). Such a second means for reducing is preferably a vacuum means, as discussed above, and a high-vacuum valve 52 is positioned between the vacuum means and the isolation chamber to allow for pressure reduction as described.

It will be appreciated that the processing chamber further includes a means for depositing a desired material onto the substrate. In one embodiment of the invention, material is deposited on the substrate by ion beam deposition. In a preferred embodiment, the apparatus is for use in a processing chamber where deposition of a carbon overcoat occurs by ion beam deposition. Working gases for deposition of a carbon overcoat by ion beam deposition include any hydrocarbon gas, such as $CH_4$, $C_2H_4$. In other embodiments, the means for depositing a material onto the substrate is a sputtering target, e.g., a chromium, magnetic or graphite target, in conjunction with an inert or reactive working gas. Exemplary magnetic targets are known to those of skill in the art. Other means for depositing a material onto the substrate includes chemical vapor deposition, plasma chemical vapor deposition, microwave plasma deposition, and cathodic arc-based deposition. The processing chamber, accordingly, includes a line for introduction of the working gases with the necessary valving for regulation.

Figure 3A:
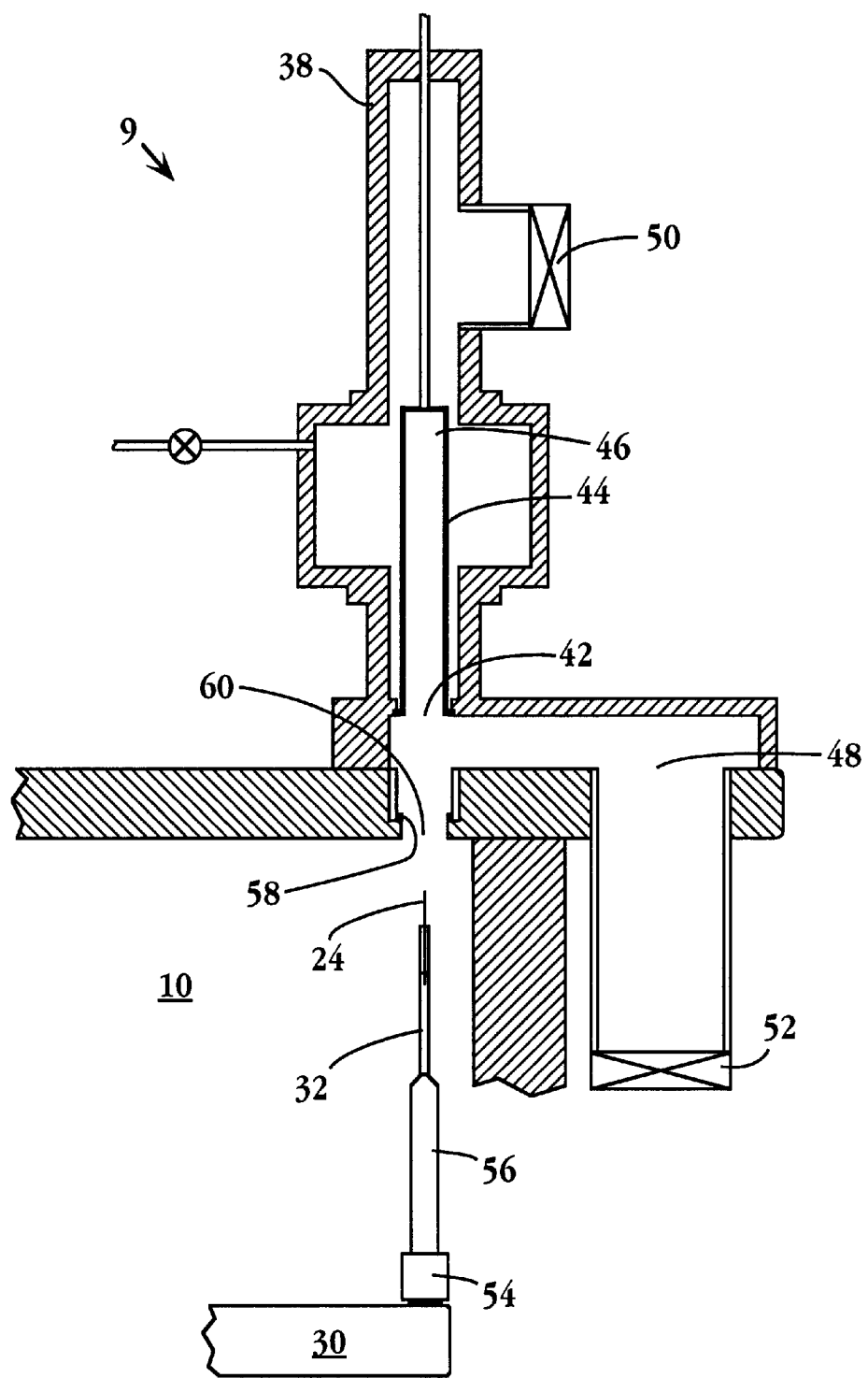
FIGS. 3A–3F illustrate the series of steps in using the processing chamber of the invention, where the disc is transported to the chamber (FIGS. 3A–3B), the internal casing member moves into its deposition position, thereby opening the isolation chamber (FIG. 3C), a film is deposited on the substrate (FIG. 3D), the internal casing moves into its isolation position (FIG. 3E) to effectively isolate the coated disc from the processing chamber and to allow for cleaning of the processing chamber. The disc is then transported out of the processing chamber (FIG. 3F).
Figure 3B:
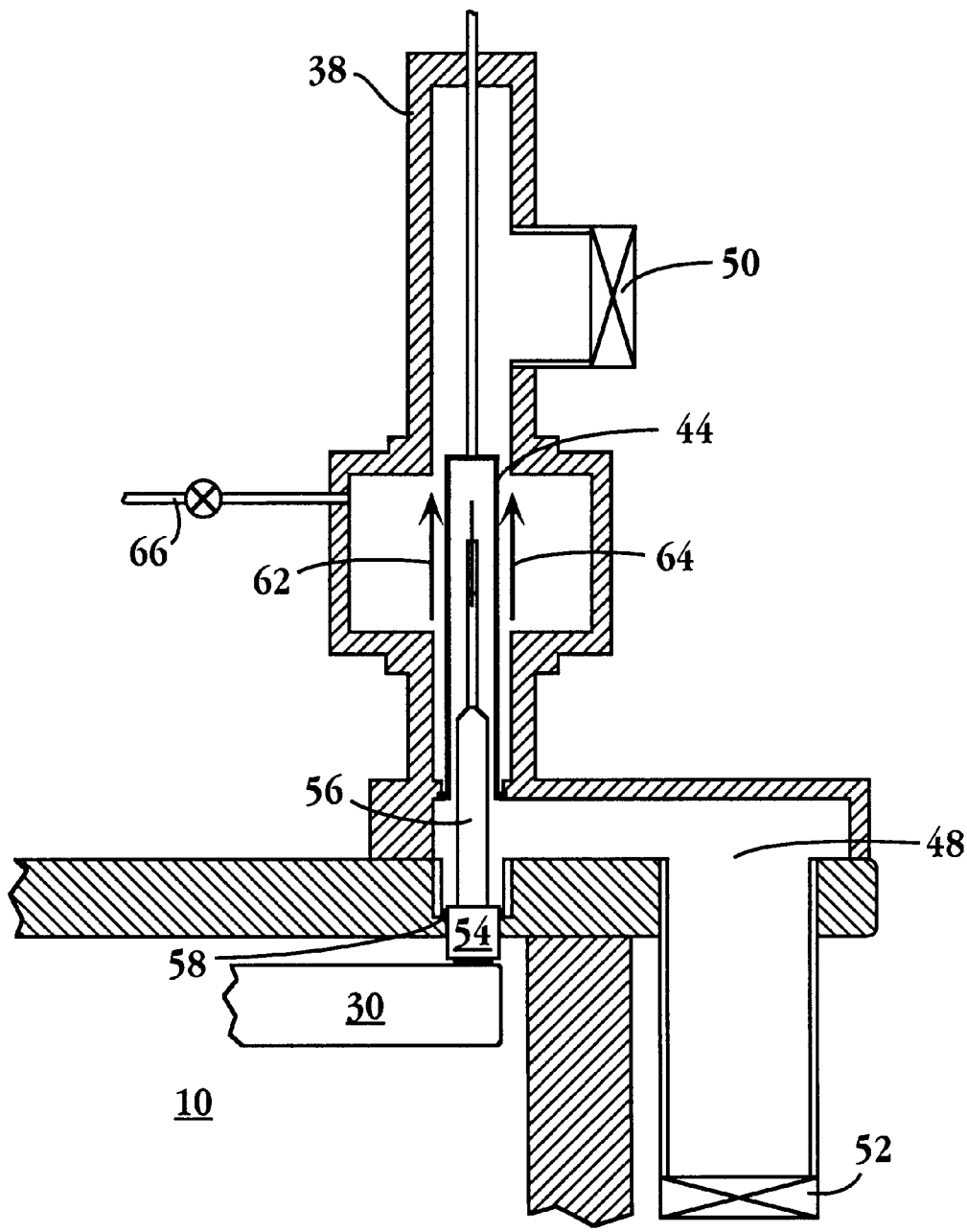

Turning now to FIGS. 3A–3F, the method of using the apparatus of the invention for reducing cross-contamination and for cleaning or removing a processing chamber will now be described, in conjunction wit Example 1. FIG. 3A shows the configuration of the apparatus at the beginning of a deposition cycle, where the internal casing member 44 is in sealing engagement with the opening to the processing chamber, defining isolation chamber 46. The carousel 30 is moved so as to introduce the disc 24, which is supported in a vertical plane by disc-holder 32, into isolation chamber 46. The disc holder is moved until a flange portion 54 of pedestal 56 on which the disc holder is carried engages a sealing member 58 in passageway 60, as best illustrated in FIG. 3B. Engagement of flange 54 with sealing member 58 forms a vacuum-tight seal to isolate the buffer chamber 48, the isolation chamber 46 and, ultimately, the processing chamber 40 from the common or main chamber 10 of the apparatus.

With continuing reference to FIG. 3B, the internal casing member is moved from its position which defines an isolation chamber to a position which allows for exposure of the substrate to the means in the chamber for deposition of a material onto the substrate, e.g., the internal casing is moved into a position that allows for deposition of material onto the substrate. Movement of the internal casing is depicted in FIG. 3B by arrows 62, 64. During or immediately after movement of the internal casing into its deposition position, the means for deposition is activated to initiate deposition of material on the substrate. For example, in the embodiment where the means for deposition is ion beam, the working gas for deposition is introduced into the processing chamber via line 66. In the embodiment where the means for deposition is sputtering, sputtering targets position in the processing are activated and, if necessary, the pressure of the chamber is adjusted by introduction of an inert gas through line 66. A reactive gas, such as nitrogen or hydrogen, can also be introduced.

Movement of the internal casing is achieved by any number of ways, not limited to that depicted in the figures. In the figures, the internal casing is mounted through the external casing and movement is achieved by moving the rod to which the casing is attached. Movement can be achieved by a magnetic drive, bellows, a linear motor, or the internal casing can be configured to move as a swing arm.

Figure 3C:
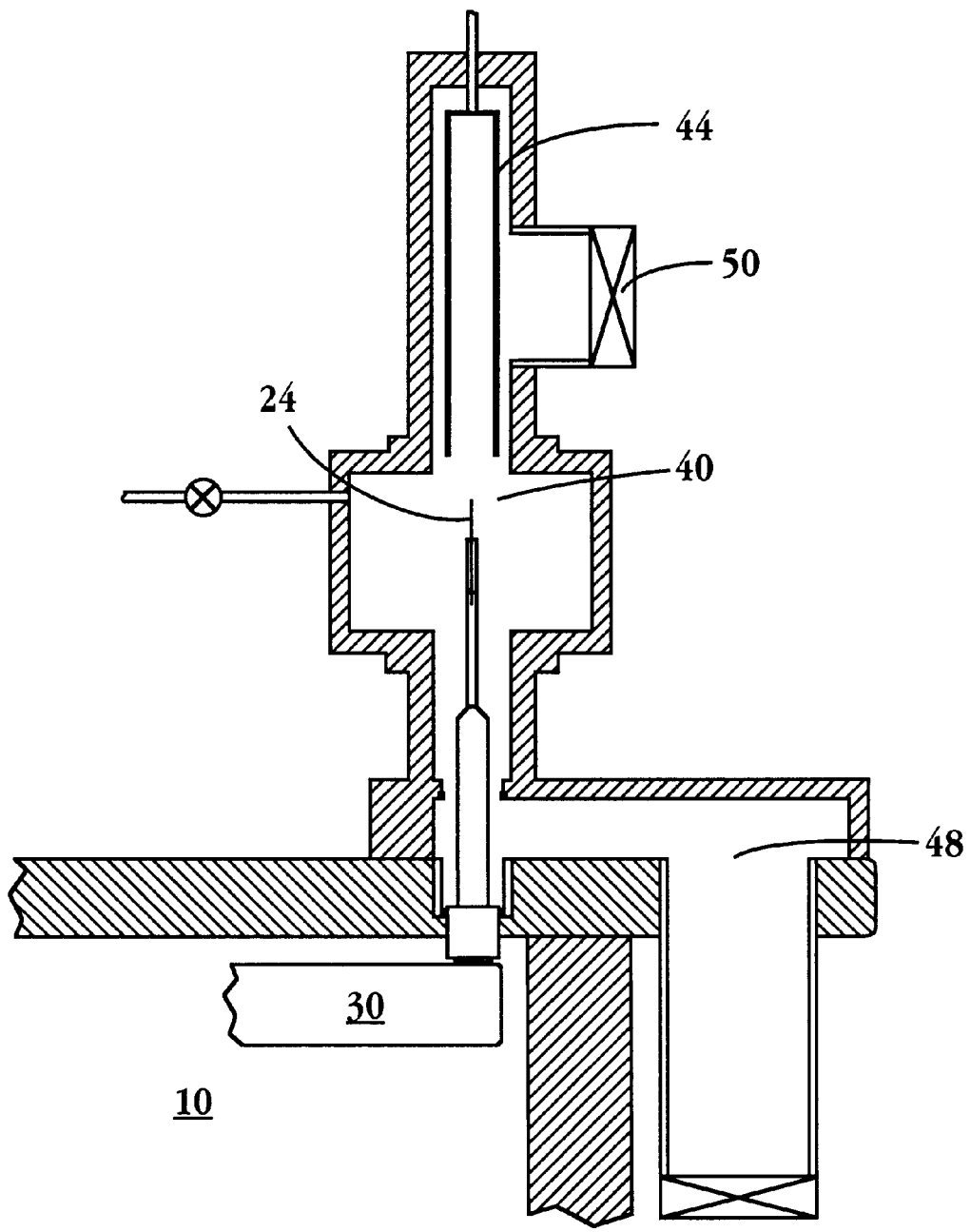
Figure 3D:
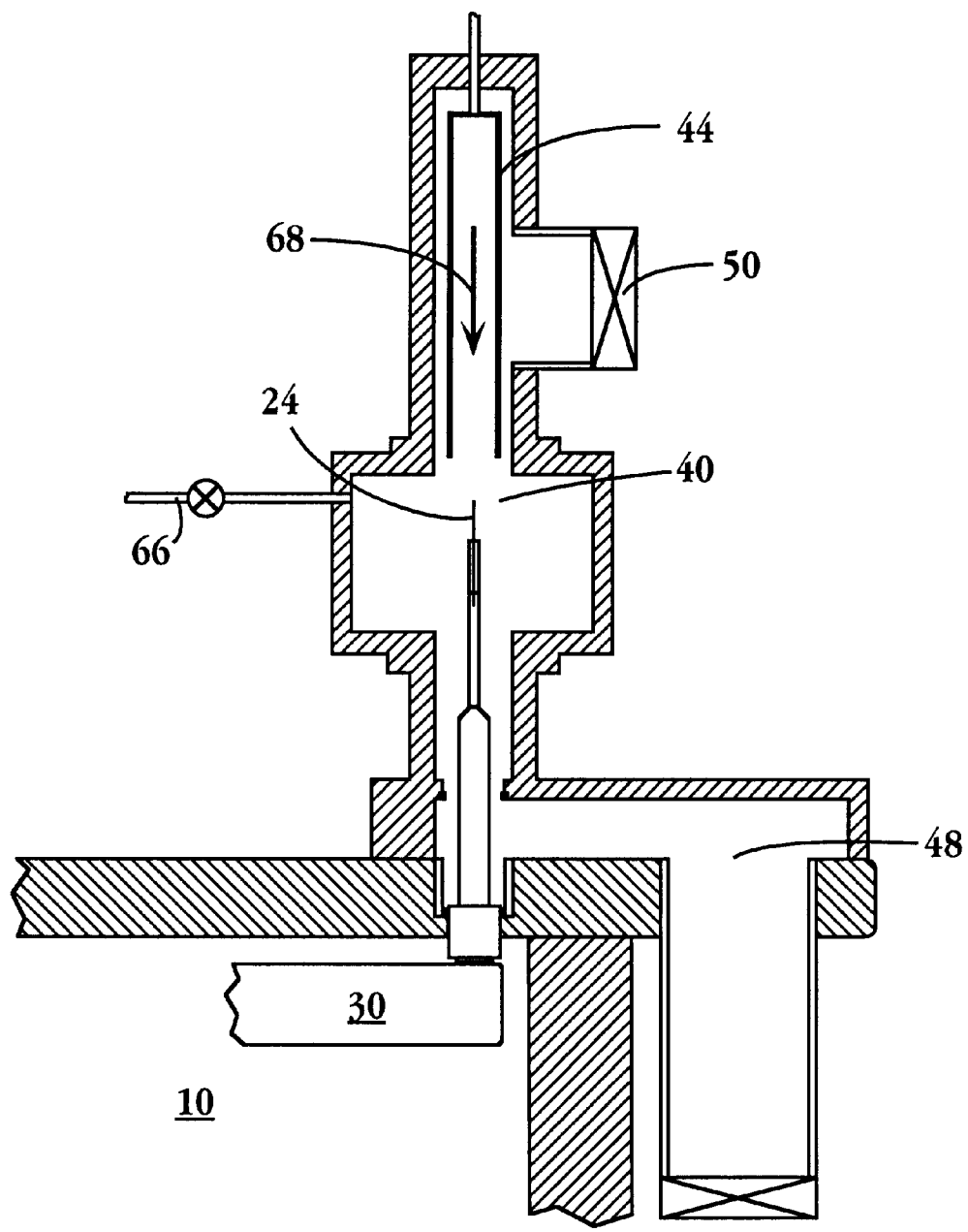
Figure 3E:
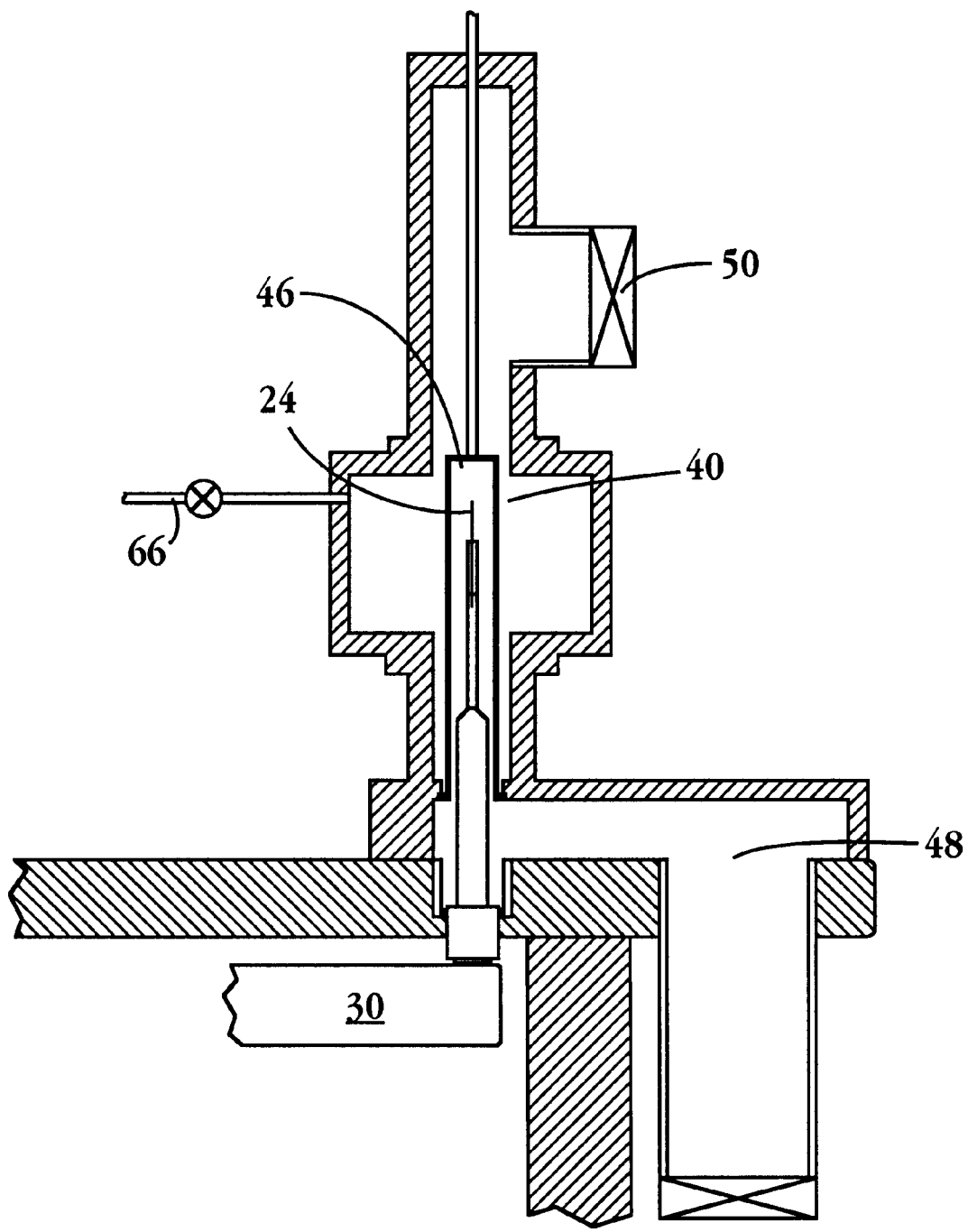

After the internal casing member is fully moved into the position to permit deposition onto the substrate, as shown in FIG. 3C, deposition of material onto the substrate is achieved and continued for the desired time. After the processing time has elapsed and deposition is complete, the deposition source, e.g., ion beam, sputtering target, is inactivated and the flow of working gas is discontinued. The internal casing member is moved, as depicted by arrow 68 in FIG. 3D, to the position where the member sealingly engages the opening into the processing chamber, thereby forming the isolation chamber in which the processed substrate is isolated from the processing chamber, as seen in FIG. 3E.

Valve 50 is opened to permit the first pumping means to remove the working gas from the processing chamber. Valve 52 is also opened to permit the second pumping means to remove working gas from the isolation chamber and from the buffer chamber. This configuration of pumping means allows for rapid evacuation of the three chambers, with evacuation of the isolation chamber and buffer chamber proceeding more rapidly than in the processing chamber due to the smaller volume of these chambers. This configuration of pumping means allows for high productivity, however it will be appreciated that a single pumping means positioned to evacuate the processing chamber when the internal casing is sealingly engaged with the opening to the processing chamber would be suitable. In this case, evacuation of the processing chamber is performed prior to movement of the internal casing to its position which defines the isolation chamber.

Figure 3F:
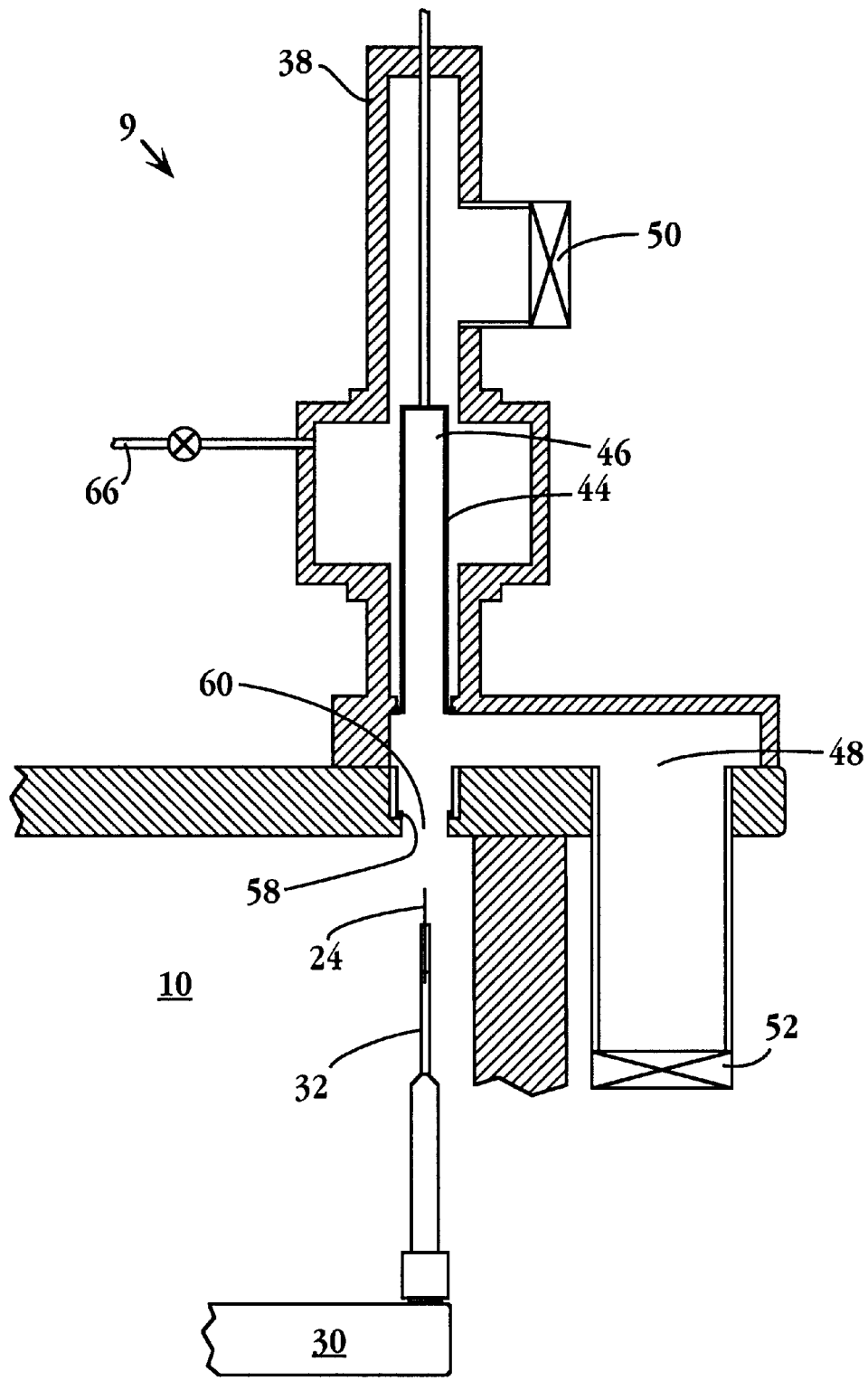

As described above, in one embodiment of the invention, the apparatus provides a method of cleaning the processing chamber after processing of a disc or a group of discs. This embodiment is now explained with reference to FIGS. 3E and 3F, where after deposition of material onto the disc, the internal casing is moved into sealing engagement with the opening to the processing chamber (FIG. 3E). A cleaning gas, such as oxygen, is introduced into the processing chamber for removal of particulate contaminants, such as carbonaceous deposits after deposition of a carbon overcoat layer. The processed substrate is protected from the cleaning gas and cleaning of the chamber continues while the processed substrate is removed for the chamber for transport to another processing chamber downstream in the system (FIG. 3F). In this way, the processing chamber is cleaned of any residual impurities during transport time, thus at no cost to productivity.

It will be appreciated that the processing chamber can be cleaned after each disc is processed, or after a group of discs are processed. The latter option is particularly viable when two processing chambers are in series for deposition of identical materials onto a substrate. When one chamber is being cleaned, the other chamber is working.

In studies performed in support of the invention, discs were prepared as described in the Example set forth below and the particle concentration on the surface of each disc was measured with an optical defect analyzer (IBM, San Jose, Calif.). Discs prepared in accordance with the invention, as per the Example where the processing chamber was oxygen plasma cleaned after ion beam deposition of a carbon overcoat on each disc, had an average (based on 100 discs) particle count of 30 particles per disc surface. In contrast, discs prepared in a conventional processing chamber that was not oxygen plasma cleaned had an average (based on 100 discs) particle count of 450 particles per disc surface.

It will also be appreciated, based on the discussion of FIGS. 3A–3F, how the apparatus further provides for a reduction in cross-contamination between processing chambers in the apparatus, since the main chamber of the apparatus is in communication with just the isolation chamber and buffer chamber during disc transport.

EXAMPLES

The following example illustrates the use of the apparatus for cleaning after deposition of a layer onto a substrate. The example is intended to be illustrative and in no way limiting to the scope of the invention.

A nickel-plated aluminum substrate was loaded into a processing apparatus and processed as follows. In the first processing chamber, the substrate was heated to a temperature of 250° C., and then shuttled through processing chambers for deposition of a chromium underlayer and a CoCr-TaPt magnetic layer. A carbon overcoat was deposited on the medium in a process chamber equipped with an ion beam source and an internal casing in accordance with the invention. Prior to entry of the medium into the processing chamber for deposition of a carbon overcoat, the internal casing member was in sealing engagement with the opening to the processing chamber. The pressure in the processing chamber and in the isolation chamber were 2.8 mTorr and $1 \times 10^{-6}$ mTorr, respectively. The medium was introduced into the isolation chamber. As the internal casing was moved into its deposition position to expose the medium to the source for deposition of material onto the substrate, ethylene was introduced into the processing chamber at a flow rate of 20 sccm to a pressure of 2.8 mTorr. The medium was exposed for deposition of a carbon overcoat for between 3–5 seconds, after which entry of the processing gas was turned off, the internal casing begins to move toward its position in sealing engagement with the opening, and valves to vacuum sources are opened to evacuate both the processing chamber and the isolation chamber. After the internal casing is in full sealing engagement with the opening to the processing chamber, oxygen is introduced to the processing chamber for cleaning of the chamber. The chamber is cleaned for about 3 seconds, and during the cleaning time the medium is transported out of the isolation chamber and into the main chamber by lowering of the carousel. After the 3 second clean in the processing chamber, the oxygen flow to the chamber is ceased during transport of the medium into the next processing chamber and introduction of a new medium into the isolation chamber, the processing chamber is evacuated.

By this process, 450 discs can be processed in one hour, at the rate of 8 seconds/disc, as summarized in the following table:

| Process Step | Oxygen Flow | Process Gas ($C_2H_4$) | Position of Internal Casing | Transport Carousel Position | Time (sec) |
|---|---|---|---|---|---|
| start | off | turning on | start moving to "open" deposition position | up | 0.5 |
| processing/deposition | off | on | "open" | up | 4 |
| pump out | off | off | start moving to "closed" isolation position | up | 0.5 |

-continued

| Process Step | Oxygen Flow | Process Gas (C₂H₄) | Position of Internal Casing | Transport Carousel Position | Time (sec) |
|---|---|---|---|---|---|
| oxygen clean | on | off | "closed" | up | 2 |
| evacuate isolation chamber and transport | on | off | "closed" | moving down to main chamber | 3* |
| end oxygen clean, evacuate processing chamber | off | off | "closed" | in motion | 1 |

*this process step occur simultaneously with the oxygen clean and the evacuation of the processing chamber after oxygen cleaning.

In this process, the first three steps total 5 seconds. After movement of the internal casing to its "closed" position, the fourth and fifth events in the table can happen simultaneously. For example, the isolation chamber can be evacuated for 0.5 second and then the carousel lowered and the medium transported from the isolation chamber (2.5 seconds). At the same time, the processing chamber is oxygen-cleaned for 2 seconds and then evacuated for 1 second before the process beings again with a new substrate.

Although the invention has been described with respect to particular embodiments, it will be apparent to those skilled in the art that various changes and modifications can be made without departing from the invention.

It is claimed:

1. In an apparatus having an external casing defining a processing chamber for deposition of a film on a substrate and an opening in the processing chamber through which a substrate is introduced for deposition, an improvement comprising an internal casing member moveably mounted within the processing chamber for movement between a first position which allows deposition onto the substrate to occur and a second position at which the casing is in sealing engagement with the opening to form an isolation chamber within the processing chamber and effective to isolate the substrate from processing chamber.

2. The apparatus of claim 1, wherein the processing chamber is at a deposition pressure when the internal casing member is in the first, deposition position and said apparatus further includes a first means for reducing the deposition pressure when the internal casing is in the first position.

3. The apparatus of claim 2, wherein the apparatus includes a second means for reducing the deposition pressure when the casing is in the second position, said first and second means for reducing disposed such that the first means for reducing is effective to change the deposition pressure in the processing chamber and the second means for reducing is effective to change the pressure in the isolation chamber.

4. The apparatus of claim 3, wherein said first means for reducing and said second means for reducing are vacuum pumps.

5. The apparatus of claim 1, where the processing chamber includes a means for depositing a film on the substrate.

6. The apparatus of claim 5, wherein the means for depositing is an ion beam and a deposition material.

7. The apparatus of claim 6, wherein the deposition material is an ionizable gas.

8. The apparatus of claim 5, wherein the means for depositing is a sputtering target and a voltage source.

9. The apparatus of claim 5, wherein the means for depositing is an electrode and an ionizable gas.

10. The apparatus of claim 1, wherein the substrate is a rigid, disc substrate.

* * * * *